(12) United States Patent
Miyao et al.

(10) Patent No.: US 8,963,124 B2
(45) Date of Patent: Feb. 24, 2015

(54) SEMICONDUCTOR DEVICE INCLUDING A PLURALITY OF DIFFERENT FUNCTIONAL ELEMENTS AND METHOD OF MANUFACTURING THE SAME

(75) Inventors: Masanobu Miyao, Fukuoka (JP); Hiroshi Nakashima, Fukuoka (JP); Taizoh Sadoh, Fukuoka (JP); Ichiro Mizushima, Yokohama (JP); Masaki Yoshimaru, Hachioji (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 781 days.

(21) Appl. No.: 12/405,505

(22) Filed: Mar. 17, 2009

(65) Prior Publication Data
US 2009/0236587 A1 Sep. 24, 2009

(30) Foreign Application Priority Data

Mar. 18, 2008 (JP) .................................. 2008-070403

(51) Int. Cl.
*H01L 29/06* (2006.01)
*H01L 31/00* (2006.01)
(Continued)

(52) U.S. Cl.
CPC ....... *H01L 27/0617* (2013.01); *H01L 21/02672* (2013.01); *H01L 29/66984* (2013.01)
USPC ................... 257/19; 257/63; 257/64; 257/65; 257/66; 257/70; 257/75; 257/E21.09; 257/E21.102; 257/E21.114; 257/E21.133; 438/117; 438/486

(58) Field of Classification Search
CPC ... H01L 28/55; H01L 21/3226; H01L 21/324; H01L 29/516; H01L 21/02425; H01L 29/66984; H01L 21/02521; H01L 21/02524; H01L 31/1872
USPC ................ 257/19, 63–66, 69, 70, 75, E21.09, 257/E21.092, E21.102, E21.114, E21.115, 257/E21.12, E21.133; 438/117, 486
See application file for complete search history.

(56) References Cited

U.S. PATENT DOCUMENTS

| | | | |
|---|---|---|---|
| 7,166,517 B1 * | 1/2007 | Miyauchi et al. | 438/313 |
| 7,629,658 B2 * | 12/2009 | Sugiyama et al. | 257/421 |
| 2007/0029553 A1 * | 2/2007 | Ozturk et al. | 257/63 |

FOREIGN PATENT DOCUMENTS

| | | |
|---|---|---|
| JP | 58-25221 A | 2/1983 |
| JP | 5-129200 | 5/1993 |

(Continued)

OTHER PUBLICATIONS

M. Miyao et al., "Recent Progress of SiGe Heterostructure Technologies for Novel Devices", ECS Trans. 2006, vol. 2, issue 1, 165-179.*

(Continued)

*Primary Examiner* — Meiya Li
(74) *Attorney, Agent, or Firm* — Oblon, Spivak, McClelland, Maier & Neustadt, L.L.P.

(57) ABSTRACT

At least first and second $Si_{1-x}Ge_x$ ($0 \leq x \leq 1$) layers are formed on an insulating film. At least first and second material layers are formed correspondingly to the at least first and second $Si_{1-x}Ge_x$ ($0 \leq x \leq 1$) layers. A lattice constant of the first $Si_{1-x}Ge_x$ ($0 \leq x \leq 1$) layer is matched with a lattice constant of the first material layer. A lattice constant of the second $Si_{1-x}Ge_x$ ($0 \leq x \leq 1$) layer is matched with a lattice constant of the second material layer.

6 Claims, 8 Drawing Sheets

(51) Int. Cl.
*H01L 27/06* (2006.01)
*H01L 21/02* (2006.01)
*H01L 29/66* (2006.01)

(56) References Cited

FOREIGN PATENT DOCUMENTS

| JP | 2002-280568 | | 9/2002 |
|----|-------------|---|--------|
| JP | 2003-60211 | | 2/2003 |
| JP | 2004-260145 | | 9/2004 |
| JP | 2005-536054 | A | 11/2005 |
| JP | 2006-140503 | | 6/2006 |
| JP | 2007-43141 | A | 2/2007 |
| JP | 2007-281442 | A | 10/2007 |

OTHER PUBLICATIONS

B-Y. Tsaur, et al., "Low-dislocation-density GaAs epilayers grown on Ge-coated Si substrates by means of lateral epitaxial overgrowth", Appl. Phys. Lett. vol. 41, No. 4; Aug. 15, 1982, pp. 347-349

Office Action issued Jan. 15, 2013 in Japanese Patent Application No. 2010-182513 with English language translation.

B-Y. Tsaur, et al., "Low-dislocation-density GaAs epilayers grown on Ge-coated Si substrates by means of lateral epitaxial overgrowth", Appl. Phys. Lett. vol. 41, No. 4; Aug. 15, 1982, pp. 347-349.

Masanobu Miyao, et al., "Si Hetero Supramolecular Structure and its Device Application", Applied Physics, vol. 61, No. 11, 1992, pp. 1104-1115.

\* cited by examiner

SEMICONDUCTOR DEVICE INCLUDING A PLURALITY OF DIFFERENT FUNCTIONAL ELEMENTS AND METHOD OF MANUFACTURING THE SAME

CROSS-REFERENCE TO RELATED APPLICATIONS

This application is based upon and claims the benefit of priority from prior Japanese Patent Application No. 2008-070403, filed Mar. 18, 2008, the entire contents of which are incorporated herein by reference.

BACKGROUND OF THE INVENTION

1. Field of the Invention

The present invention relates to a semiconductor device including a plurality of different functional elements on a silicon substrate, for example, a semiconductor element having an optical function and a semiconductor element having a spin function. Further, the present invention relates to a method of manufacturing the semiconductor device.

2. Description of the Related Art

Recently, there has been great demand to realize a ubiquitous information society. For example, miniaturization, high functionality, multi-functionality or personalization is required with respect to various information communication apparatuses and information terminals, typically, a mobile phone. Simultaneously, the following demands are strongly made with respect to information communication apparatuses and information terminals. For example, high speed of information processing speed, diversification of handling information and large capacity or low power consumption are required.

In order to meet the demands, scale reduction of a semiconductor device and high integration of integrated circuits have been researched and developed. In the scale reduction and high integration, according to a so-called Si-LSI technique, that is, the semiconductor manufacturing technique mainly using silicon (Si) as a material, so-called scaling is realized as a main guiding principle. However, there is a limit to the foregoing scaling; for this reason, a new guiding principle overcoming the scaling is required.

As one of the guiding principle, new materials having a carrier mobility higher than Si, for example, Ge, SiGe, strain Si, strain SiGe and strain Ge have attracted very interest. The following study has been made using these materials described above (e.g., see the following document). Specifically, one is the study of improving the operation speed of LSIs using the new materials. The other is the study of forming a Ge layer on an Si substrate as a buffer, and crystallizing and grow a GaAs layer having an optical function on the Si substrate via the Ge layer.

Document: "Si Hetero Supramolecular Structure and its Device Application": Masanobu MIYAO, Kiyokazu NAKAGAWA, Applied Physics, vol. 61, No. 11, P. 1104, 1992~"Low-dislocation-density GaAs epilayers grown on Ge-coated Si substrates by means of lateral epitaxial overgrowth": Appl. Phys. Lett. 41, 347, (1982).

However, SiGe crystal and GaAs crystal have a lattice constant different from an Si substrate. For this reason, if the materials are directly formed on the Si substrate, unfavorable stress and load are applied to each material, and thus, defect occurs. As a result, there is a possibility that the materials cannot sufficiently perform their inherently excellent functions. In addition, strain Si and strain Ge are formed on a buffer layer having a lattice constant different from Si and Ge.

In this case, there is a need to precisely control the difference between these lattice constants. Further, these SiGe crystal, strain Si crystal, strain Ge crystal or GaAs crystal have different lattice constant. For this reason, even if a Ge layer is suitable as the front-end layer of a GaAs crystal, the following problem arises. Specifically, when SiGe crystal and strain Si crystal are directly formed on the Ge layer, there is a possibility that the same disadvantage as above happens. Therefore, it is difficult to simply stack SiGe crystal, strain Si crystal and GaAs crystal on the Si substrate and on the Ge layer.

In order to solve the foregoing problem, the following technique has a need to be developed to innovatively improve the performance of a semiconductor integrated circuit and to achieve high integration. According to the technique, an electronic functional element, an optical functional element and a spin functional element are stacked on one substrate. Therefore, it is desired to develop the technique capable of stacking a plurality of semiconductor elements having the functions and formed of materials different lattice constant on the identical substrate.

BRIEF SUMMARY OF THE INVENTION

According to a first aspect of the invention, there is provided a semiconductor device comprising: an insulating film; at least first and second $Si_{1-x}Ge_x$ ($0 \leq x \leq 1$) layers formed on the insulating film; and at least first and second material layers formed correspondingly to said at least first and second $Si_{1-x}Ge_x$ ($0 \leq x \leq 1$) layers, a lattice constant of the first $Si_{1-x}Ge_x$ ($0 \leq x \leq 1$) layer being matched with a lattice constant of the first material layer, a lattice constant of the second $Si_{1-x}Ge_x$ ($0 \leq x \leq 1$) layer being matched with a lattice constant of the second material layer.

According to a second aspect of the invention, there is provided a semiconductor device comprising: a first insulating film; a first $Si_{1-x}Ge_x$ ($0 \leq x \leq 1$) layer formed on the first insulating film; a first material layer formed on the first $Si_{1-x}Ge_x$ ($0 \leq x \leq 1$) layer, a second insulating film covering the first material layer; a second $Si_{1-x}Ge_x$ ($0 \leq x \leq 1$) layer formed on the second insulating film; and a second material layer formed on the second $Si_{1-x}Ge_x$ ($0 \leq x \leq 1$) layer, a lattice constant of the first $Si_{1-x}Ge_x$ ($0 \leq x \leq 1$) layer being matched with a lattice constant of the first material layer, a lattice constant of the second $Si_{1-x}Ge_x$ ($0 \leq x \leq 1$) layer being matched with a lattice constant of the second material layer.

According to a third aspect of the invention, there is provided a method of manufacturing a semiconductor device, comprising: forming an insulating film on a part of a silicon substrate; forming an amorphous SiGe layer on the silicon substrate and the insulating film; and heating the silicon substrate so that the amorphous SiGe layer is laterally solid-phase or liquid-phase grown on the insulating film, and thereby, forming a crystallized SiGe layer on the silicon substrate and the insulating film, the crystallized SiGe layer being formed on an SiGe layer having a lattice constant matched with a material layer formed later.

According to a fourth aspect of the invention, there is provided a method of manufacturing a semiconductor device, comprising: forming an amorphous SiGe layer on an insulating film; forming an inducer for crystallizing the amorphous SiGe layer on the amorphous SiGe layer; and heating the amorphous SiGe layer to crystallize the amorphous SiGe layer from the inducer, the crystallized SiGe layer being formed on an SiGe layer having a lattice constant matched with a material layer formed later.

According to a fifth aspect of the invention, there is provided a method of manufacturing a semiconductor device, comprising: forming at least first and second $Si_{1-x}Ge_x$ ($0 \leq x \leq 1$) layers formed on an insulating film; and forming at least first and second material layers formed correspondingly to said at least first and second $Si_{1-x}Ge_x$ ($0 \leq x \leq 1$) layers, a lattice constant of the first $Si_{1-x}Ge_x$ ($0 \leq x \leq 1$) layer being matched with a lattice constant of the first material layer, a lattice constant of the second $Si_{1-x}Ge_x$ ($0 \leq x \leq 1$) layer being matched with a lattice constant of the second material layer.

According to a sixth aspect of the invention, there is provided a method of manufacturing a semiconductor device, comprising: forming a first $Si_{1-x}Ge_x$ ($0 \leq x \leq 1$) layer having a lattice constant matched with a first material layer formed later on an first insulating film; forming the first material layer on the first $Si_{1-x}Ge_x$ ($0 \leq x \leq 1$) layer; forming a second insulating film covering the first $Si_{1-x}Ge_x$ ($0 \leq x \leq 1$) layer and the first material layer; forming a second $Si_{1-x}Ge_x$ ($0 \leq x \leq 1$) layer having a lattice constant matched with a second material layer formed later on the second insulating film; and forming the second material layer on the second $Si_{1-x}Ge_x$ ($0 \leq x \leq 1$) layer.

DETAILED DESCRIPTION OF THE INVENTION

Various embodiments of the present invention will be hereinafter described with reference to the accompanying drawings.

The structure of a semiconductor device realized by the present invention will be described with reference to the first and second embodiments.

First Embodiment

Figure 1:
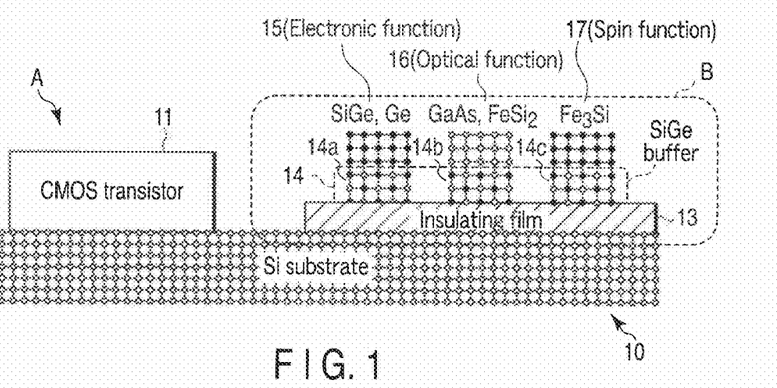
FIG. 1 is a view schematically showing the structure of a semiconductor device according to a first embodiment of the present invention.

FIG. 1 is a view schematically showing the structure of a semiconductor device according to a first embodiment of the present invention. FIG. 1 shows the case of monolithically forming an electronic functional element, an optical functional element and a spin functional element on one silicon (Si) substrate.

The electronic functional element is a transistor using Ge and SiGe, for example. The optical functional element is a light-emitting element and light-receiving element using GaAs and $FeSi_2$, for example. The spin functional element is a spin transistor using $Fe_3Si$, for example. However, the functional element is not limited to the functional elements described above.

In FIG. 1, a first range A of a silicon substrate 10 is a range for forming a CMOS transistor 11 including known N-channel and P-channel MOS transistors. For example, the first range A is formed with a memory cell, a logic operation circuit and a liquid crystal display, which are composed of the CMOS transistor 11. A second range B of the silicon substrate 11 is a range for forming a plurality of functional elements. In the second range B, an insulating film 13 consisting of a silicon oxide film is formed on the silicon substrate 10. A universal buffer layer 14 (hereinafter, referred to as buffer layer) is formed on the insulating film 13. The buffer layer 14 is composed of SiGe layers 14a, 14b and 14c having different lattice constant. Specifically, these SiGe layers 14a, 14b and 14c have a lattice constant equally set to the following layers 15, 16 and 17, which are formed on there, respectively. For example, a SiGe layer or Ge layer 15 configures an electronic functional element. A GaAs layer or $FeSi_2$ layer 16 configures an optical functional element. A $Fe_3Si$ layer 17 configures a spin functional element. The SiGe layers 14a, 14b, 14c, SiGe layer or Ge layer 15, GaAs layer or $FeSi_2$ layer 16 and $Fe_3Si$ layer 17 are isolated by an insulating film (not shown).

Figure 2:
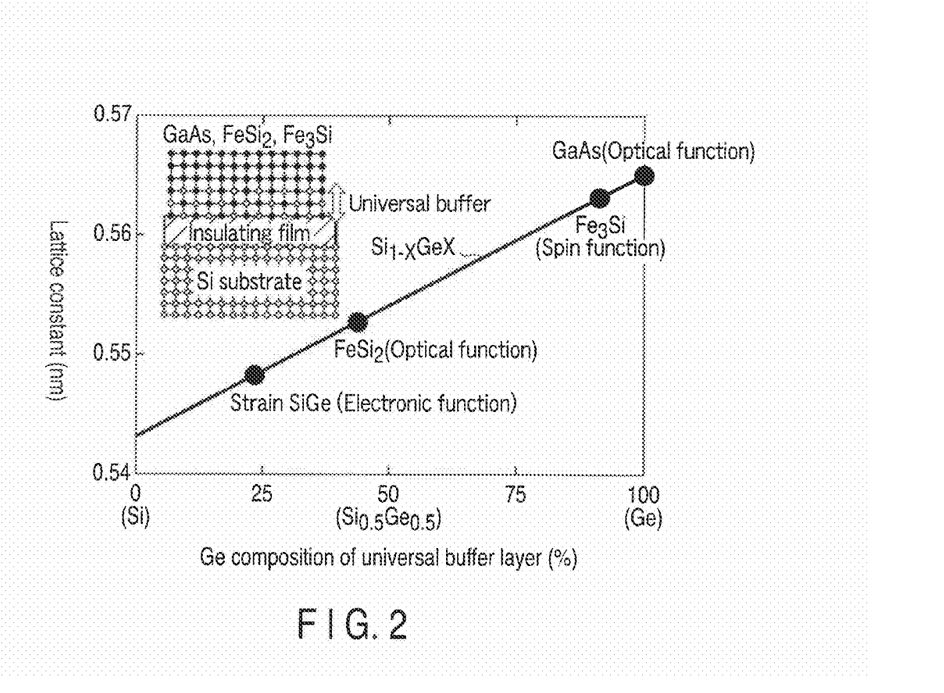
FIG. 2 is a graph to explain the relationship between a mixed crystal ratio and a lattice constant.

FIG. 2 shows the relationship between a mixed crystal ratio and a lattice constant in an SiGe layer. As seen from FIG. 2, the lattice constant of a material group having new functions such as optic and spin is greatly different from the lattice constant of silicon: 0.543 nm. For example, the material GaAs is 0.565 nm, $FeSi_2$ is 0.554 nm, and $Fe_3Si$ is 0.564 nm. For this reason, if the materials are stacked on a silicon substrate, a crystal growth template is required. An $Si_{1-x}Ge_x$ ($0 \leq x \leq 1$) mixed crystal is a total-rate solid solution semiconductor. The mixed crystal ratio (x) is changed, and thereby, the lattice constant is freely changed within a range from 0.543 to 0.565 nm. The lattice constant of the material group having new functions is within a range of the lattice constant of $Si_{1-x}Ge_x$. Therefore, as shown in FIG. 1, $Si_{1-x}Ge_x$ layers 14a, 14b and 14c are crystal-grown on the insulating film 13 as a buffer layer (template). Thereafter, the material group is crystal-grown on the $Si_{1-x}Ge_x$ layers 14a, 14b and 14c. In this way, it is possible to obtain a high-quality film controlling strain and having no lattice defect. Thus, desired elements having an electronic function, optical function and spin function are formed using the SiGe layer or Ge layer 15, GaAs layer or FeSi$_2$ layer 16 and Fe$_3$Si layer 17.

Crystal orientation control on the insulating film 13 will be explained in a method of forming an SiGe layer described later. For example, the following methods are given:

(1) Liquid-phase or solid-phase epitaxial growth method of SiGe;

(2) Solid-phase growth method of imprinting a catalytic metal on the surface or lower layer of SiGe, and inducing the growth of SiGe via the catalytic metal, solid-phase growth method of locally applying stress to the surface or lower layer of SiGe to grow SiGe from the stressed portion;

(3) Method of crystallizing SiGe using a crystalline insulating film such as MgO single-crystallized on a insulating film as a template; and (4) Method of forming an SiGe layer on an insulating film using metal induced crystallization (MIC).

According to the first embodiment, the Si$_{1-x}$Ge$_x$ layers 14a, 14b and 14c are provided on the insulating film formed on the silicon substrate 10 as a buffer layer having different mixed crystal ratio. These Si$_{1-x}$Ge$_x$ layers 14a, 14b and 14c are used as a template to provide the SiGe layer or Ge layer 15, GaAs layer or FeSi$_2$ layer 16 and Fe$_3$Si layer 17. Therefore, one substrate can be provided with the silicon substrate 10 and a plurality of semiconductor layers having different lattice constant. As a result, this serves to form a high-performance semiconductor device while preventing an increase of a chip area.

Second Embodiment

Figure 3:
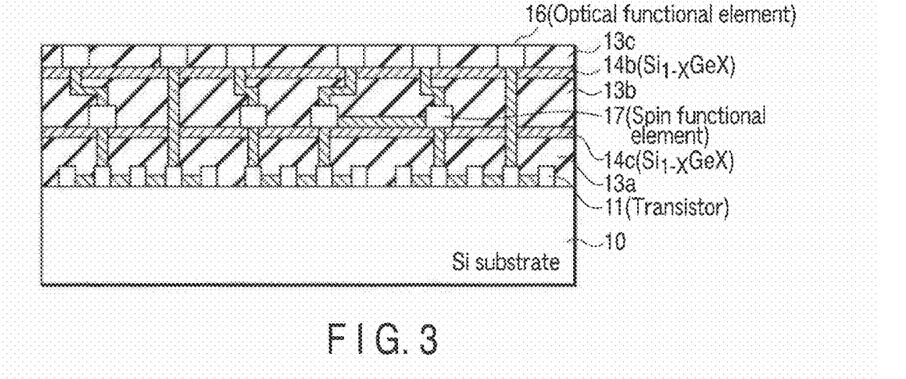
FIG. 3 is a cross-sectional view schematically showing the structure of a semiconductor device according to a second embodiment of the present invention.

FIG. 3 schematically shows the structure of a semiconductor device according to a second embodiment of the present invention. In FIG. 3, the same reference numerals are used to designate portions identical to FIG. 1. FIG. 3 shows the case of three-dimensionally forming an electronic functional element, an optical functional element and a spin functional element on one silicon substrate.

As illustrated in FIG. 3, the surface of a silicon substrate 10 is formed with a known transistor and a CMOS transistor 11. An interlayer insulating film 13a is formed on the substrate 10. For example, the interlayer insulating film 13a is formed of a silicon oxide film (e.g., TEOS film), which is formed using temperature of 50° C. or less. An Si$_{1-x}$Ge$_x$ (0≤x≤1) layer 14c is formed as a buffer layer on the interlayer insulating film 13a. For example, an Fe$_3$Si layer 17 is formed on the Si$_{1-x}$Ge$_x$ layer 14c. The lattice constant of the Si$_{1-x}$Ge$_x$ layer 14c is tuned to a lattice constant of the Fe$_3$Si layer 17. Thus, the Fe$_3$Si layer 17 having preferable film quality is formed on the Si$_{1-x}$Ge$_x$ layer 14c. A spin functional element is formed using the Fe$_3$Si layer 17.

The Fe$_3$Si layer 17 is covered with an interlayer insulating film 13b. For example, the interlayer insulating film 13b is formed of a TEOS film. An Si$_{1-x}$Ge$_x$ layer 14b is formed as a buffer layer on the interlayer insulating film 13b. A plurality of FeSi$_2$ layers 16 is formed on the Si$_{1-x}$Ge$_x$ layer 14b. The lattice constant of the Si$_{1-x}$Ge$_x$ layer 14b is tuned to a lattice constant of the FeSi$_2$ layers 16. Thus, the FeSi$_2$ layer 16 having preferable film quality is formed on the Si$_{1-x}$Ge$_x$ layer 14b. An optical functional element is formed using these FeSi$_2$ layers 16. An insulating film 13c is formed between the FeSi$_2$ layers 16. For example, a TEOS film is used as the insulating film 13c.

The optical functional element, spin functional element and CMOS transistor are connected via an interconnect layer and via.

According to the structure, the Si$_{1-x}$Ge$_x$ layer 14c and 14b are formed on the entire surface of the insulating films 13a and 13b, respectively. However, the structure is not limited; in this case, the Si$_{1-x}$Ge$_x$ layer 14c and 14b may be formed in an area only where each functional element is formed.

According to the second embodiment, the insulating film 13a is formed on the silicon substrate 10 formed with the transistor and the CMOS transistor 11. The Fe$_3$Si layer 17 is provided on the insulating film 13a via the Si$_{1-x}$Ge$_x$ layer 14c functioning as a buffer layer. Further, the FeSi$_2$ layers 16 is provided on the insulating film 13b via the Si$_{1-x}$Ge$_x$ layer 14b functioning as a buffer layer. Therefore, silicon and several materials having different lattice constant are successively stacked, and thereby, it is possible to realize a three-dimensional semiconductor device having a spin functional element and an optical functional element on one substrate.

(Method of Forming an SiGe Layer)

The following is an explanation of a method of forming an Si$_{1-x}$Ge$_x$ layer 14b functioning as a buffer layer, which is applied to the first and second embodiments.

(First Method of Forming an SiGe Layer)

Figure 4A:
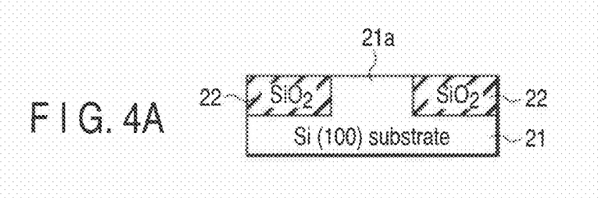
FIGS. 4A to 4C are views to explain a method of laterally forming an SiGe layer via liquid-phase epitaxial growth.
Figure 4B:
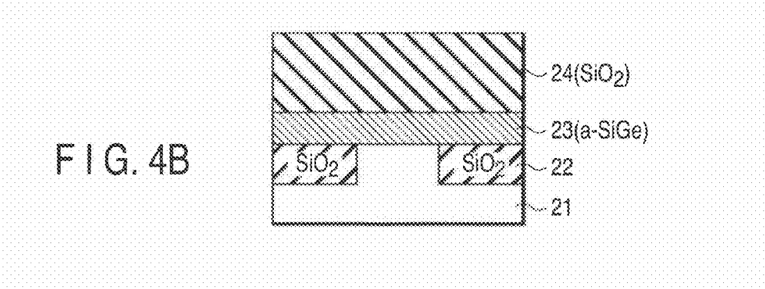
Figure 4C:
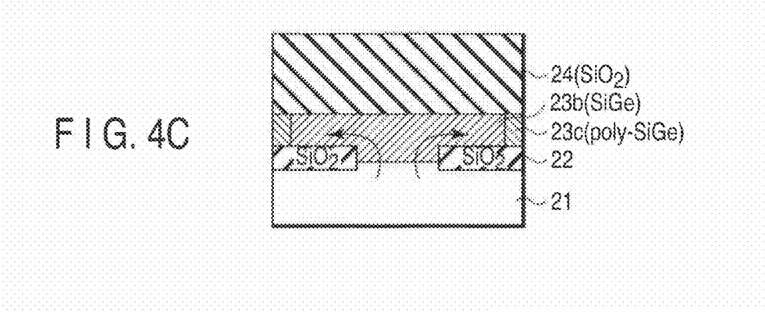

FIGS. 4A to 4C show a method of laterally growing an SiGe layer on an insulating film via solid- or liquid-phase epitaxial growth.

As shown in FIG. 4A, the surface of a silicon substrate 21 having a (100) surface is formed with a ring-like trench or two parallel trenches. A silicon oxide film 22 is filled in the trenches. The surface of the silicon oxide film 22 is planarized using etch-back or chemical mechanical polishing (CMP). As a result, a surface region 21a of the substrate 21 surrounded by the silicon oxide film 22 is formed.

As illustrated in FIG. 4B, an amorphous SiGe layer 23 is formed on the surface region 21a and the silicon oxide film 22. Further, a silicon oxide film 24 functioning as a cap layer or heat storage layer is formed on the amorphous SiGe layer 23.

As depicted in FIG. 4C, heat treatment is carried out. The heat treatment is rapid thermal anneal (RTA) at temperature of 940° C. or more, for example. The RTA temperature is different depending on a mixed crystal ratio of Si$_{1-x}$Ge$_x$.

Figure 5:
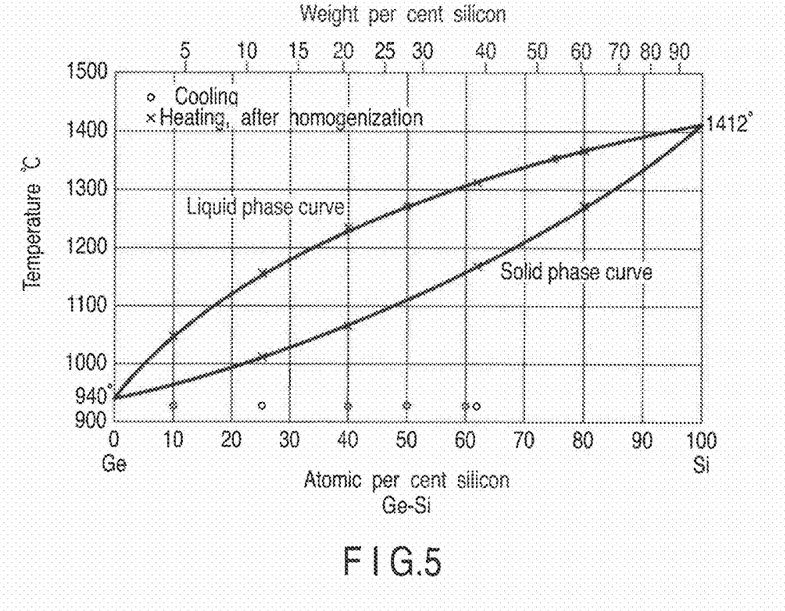
FIG. 5 is a graph to explain the relationship between a mixed crystal ratio and liquid- and solid-phase curves (lines)

FIG. 5 shows the relationship between a mixed crystal ratio and a liquid phase curve and a solid phase curve. Temperature for causing liquid- and solid-phase epitaxial growth of SiGe is different depending on the mixed crystal ratio. If SiGe is grown via liquid-phase epitaxial growth, SiGe has a need to be set to temperature of the liquid phase curve shown in FIG. 5 or more. Moreover, if SiGe is grown via solid-phase epitaxial growth, SiGe has a need to be set to temperature of the liquid phase curve or less. For this reason, according to the RTA, temperature is set in accordance with a mixed crystal ratio of Si$_{1-x}$Ge$_x$ to make solid- and liquid-phase epitaxial growths.

Specifically, as seen from FIG. 4C, when the amorphous SiGe layer 23 arrives at the temperature causing liquid-phase epitaxial growth, the substrate Si and the amorphous SiGe layer are mixed at a portion contacting with the substrate 21. A melting point of the SiGe layer is lowered together with Ge concentration. Thus, crystallization begins at the substrate Si side having Si concentration. The crystallization gradually advances in the film thickness direction, and thereafter, laterally advances. A lateral crystallization distance is set depending on RTA treatment time. When the RTA ends, portions including a crystallized SiGe layer 23b and a poly-SiGe layer 23c are grown.

It should be noted that the heat treatment is not limited to RTA. In this case, a laser beam may be irradiated to an SiGe layer forming region, and then, scanned to heat the SiGe layer.

According to the SiGe liquid-phase epitaxial growth, it is possible to form an SiGe layer having a desired lattice constant. In addition, heat treatment time is controlled, and thereby, it is possible to form an SiGe layer having a desired surface area. Therefore, this is effective in manufacturing various devices.

Moreover, the upper surface of the SiGe layer is formed with a cap layer; therefore, this serves to easily planarize the surface of the crystallized SiGe layer. As a result, this is advantageous when other material layer is formed on the SiGe layer.

The SiGe layer formed on the silicon oxide film may be elongated in the growing direction to form a stripe pattern having a width of not more than 5 μm, for example. SiGe changes in volume when it is melted and hardened. Where the SiGe layer on the oxide film is not patterned, it tends to have a rough surface as a result of the change in volume. On the other hand, where the SiGe layer is formed to have a stripe pattern, the change in volume can be absorbed as a slight widthwise deformation. Thanks to this feature, crystal growth can be performed for a long distance without causing defects. Stripe-pattern growth is disadvantageous in that a wide-area SiGe layer cannot be formed on an insulating film at a time. However, after the SiGe layer is grown to have a stripe pattern, an SiGe layer having substantially the same concentration as the stripe-pattern SiGe layer can be formed over the entire surface by vapor-phase growth. By so doing, a wide-area SiGe layer can be formed.

In the manufacturing process shown in FIGS. 4A to 4C, if the heat treatment temperature is set to the solid phase curve range, an amorphous SiGe layer is crystallized via solid-phase epitaxial growth.

If the amorphous Si layer is grown via the solid-phase epitaxial growth, when the heat treatment temperature becomes high, random polycrystal nucleus occurs in the amorphous Si layer. This is a factor of disturbing the solid-phase epitaxial growth. Therefore, a solid-phase growth distance becomes long when heat temperature is low and treatment time is long.

Conversely, according to the liquid-phase epitaxial growth, heat treatment time is short, that is, several minutes, and a generation of polycrystal nucleus may be disregarded. Therefore, when a comparison is made between liquid- and solid-phase epitaxial growths, the liquid-phase epitaxial growth is employed, and thereby, a growth distance is made long. Therefore, the liquid-phase epitaxial growth is suitable for forming a large SiGe layer.

(Second Method of Forming an SiGe Layer)

Figure 6A:
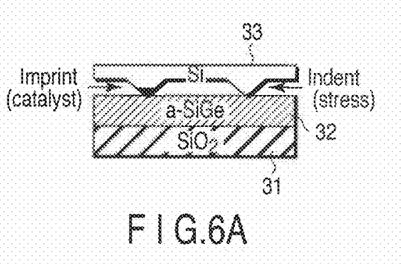
FIGS. 6A and 6B are views showing a method of forming an SiGe layer; specifically, imprint/indent growth of SiGe.

FIGS. 6A and 6B show the principle of imprint/indent growth of an SiGe layer. As shown in FIG. 6A, a silicon oxide film 31 is formed on a silicon substrate (not shown). Further, an amorphous SiGe layer 32 is formed on the silicon oxide film 31. A mixed crystal ratio of the amorphous SiGe layer 32 is previously set in accordance with a material formed thereon. For example, metal as a catalyst is imprinted on the surface of the amorphous SiGe layer 32 using an indent 33 formed of silicon. In addition, stress is applied to the surface using the indent 33. The portion formed with metal or the portion to which stress is applied functions as an inducer for crystallizing the amorphous SiGe layer 32 later. The imprinting is carried out in the following manner. Specifically, catalytic metal is vapor-deposited on the tip of a needle configuring the indent 33. Then, the catalytic metal is pressed and transferred to the surface of the amorphous SiGe layer 32. For example, metals such as Ni, Cu, Pd and Co causing a surface reaction of SiGe are used as the catalytic metal.

Although a method describe later is the same, the method of forming the catalytic metal is not limited to imprinting. For example, lithography and inkjet may be employed. According to the lithography, a catalytic metal is formed on the surface of the amorphous SiGe layer 32 in the same manner as the lithography in a semiconductor device. According to the inkjet, the catalytic metal is blown to the surface of the amorphous SiGe layer 32 to form the catalytic metal.

Figure 6B:
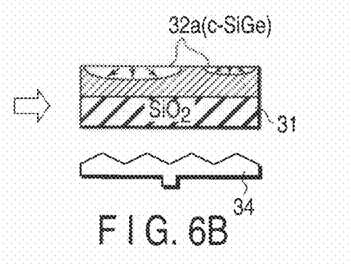

Thereafter, as illustrated in FIG. 6B, the substrate is heated using a heater 34. The heating temperature is the solid-phase epitaxial growth range temperature shown in FIG. 5, that is, temperature depending on a mixed crystal ratio of SiGe. By means of the heating, a portion of the amorphous SiGe layer 32 formed with the catalytic metal or a portion to which stress is applied is crystallized. In this way, an SiGe layer 32a having a desired lattice constant is formed.

According to the method, it is possible to an SiGe layer, which is aligned with a (111) face in crystal orientation.

Figure 7A:
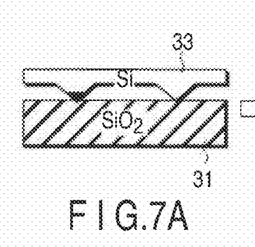
FIGS. 7A to 7C are views showing a method of forming an SiGe layer; specifically, imprint/indent growth of an SiGe/Si layer structure.
Figure 7B:
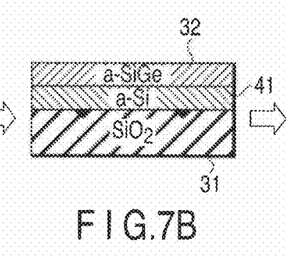
Figure 7C:
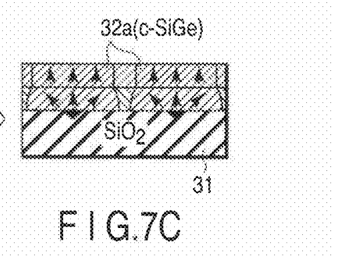

FIGS. 7A to 7C show imprint/indent growth of an SiGe/Si multi-layer structure.

According to the growth, as shown in FIG. 7A, a catalytic metal is imprinted on the surface of a silicon oxide film 31 formed on a silicon substrate (not shown) using a silicon indent 33. Further, stress is applied to the surface of the silicon oxide film 31 using the indent 33.

Thereafter, as illustrated in FIG. 7B, an amorphous silicon (Si) layer 41 and an amorphous SiGe layer 32 are successively formed on the silicon oxide film 31. The mixed crystal ratio of the amorphous SiGe layer 32 is previously set in accordance with a material formed thereon.

As depicted in FIG. 7C, heat treatment is carried out with respect to the substrate. The treatment temperature is solid-phase epitaxial growth range temperature set in accordance with the mixed crystal ratio of the amorphous SiGe layer 32. In accordance with the heat treatment, the amorphous silicon layer 41 is crystallized from the catalytic metal imprinted on the silicon oxide film 31 or from a portion where stress is applied to the silicon oxide film 31. Then, the amorphous SiGe layer 32 is crystallized using the crystal as a seed. In this way, an SiGe layer 32a having a desired lattice constant is formed.

Also, according to the growth method, it is possible to form the SiGe layer 32a, which is aligned with a (111) face in crystal orientation.

Figure 8A:
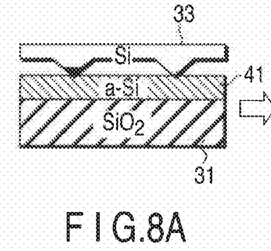
FIGS. 8A to 8C are views showing a method of forming an SiGe layer; specifically, the case of epitaxially growing an SiGe layer on imprint/indent grown silicon.
Figure 8B:
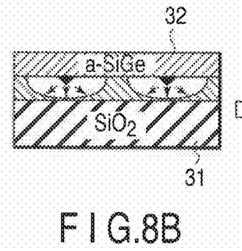
Figure 8C:
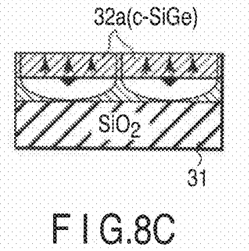

FIGS. 8A to 8C show the case of epitaxially growing an SiGe layer on an imprint/indent grown silicon.

According to the growth, as shown in FIG. 8A, an amorphous silicon layer 41 is formed on the surface of a silicon oxide film 31 formed on a silicon substrate (not shown). A catalytic metal is imprinted on the surface of the amorphous silicon layer 41 using an indent 33. Further, stress is applied to the surface of the amorphous silicon layer 41 using the indent 33.

Thereafter, as illustrated in FIG. 8B, an amorphous SiGe layer 32 is formed on the amorphous silicon layer 41. The mixed crystal ratio of the amorphous SiGe layer 32 is previously set in accordance with a material formed thereon. The amorphous SiGe layer 32 is formed, and simultaneously, the amorphous silicon layer 41 is crystallized from a portion on which the catalytic metal is imprinted or from a portion to which stress is applied.

As seen from FIG. 8C, heat treatment is carried out with respect to the substrate. The treatment temperature is solid-phase epitaxial growth range temperature set in accordance with the mixed crystal ratio of the amorphous SiGe layer 32. In accordance with the heat treatment, the amorphous SiGe layer 32 is crystallized according to the crystallized silicon layer under there. In this way, an SiGe layer 32a having a desired lattice constant is formed.

Also, according to the growth method, it is possible to form the SiGe layer 32a, which is aligned with a (111) face in crystal orientation.

(Third Method of Forming an SiGe Layer)

Figure 9A:
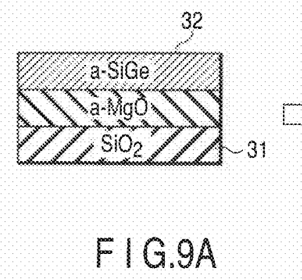
FIGS. 9A and 9B are views showing a method of forming an SiGe layer; specifically, a method of crystallizing an SiGe layer using a crystalline insulating film MgO single-crystallized on an insulating film.
Figure 9B:
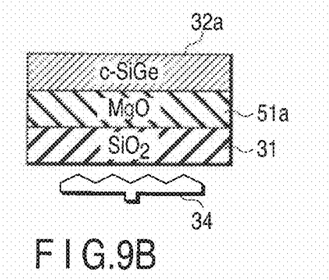

FIGS. 9A and 9B show a method of crystallizing a crystalline insulating film single-crystallized on an insulating film, for example, an SiGe layer using MgO.

As shown in FIG. 9A, an amorphous MgO layer 51 is formed on a silicon oxide film formed on a substrate (not shown). Further, an amorphous SiGe layer 32 is formed on the amorphous MgO layer 51 to provide a hetero structure.

Thereafter, as seen from FIG. 9B, heat treatment is carried out with respect to the substrate using a heater 34, for example. The heat treatment temperature is about 500° C., for example. By means of the heat treatment, the amorphous MgO layer 51 is crystallized to form an MgO layer 51a. The amorphous SiGe layer 32 is crystallized using the MgO layer 51a as a template, and thus, an SiGe layer 32a is formed.

The lattice constant of the MgO layer 51a does not fully match with that of the SiGe layer 32a. For this reason, defect is formed at the interface with the MgO layer 51 in the SiGe layer 32a. However, the SiGe layer 32 is formed relatively thicker, and thereby, it is possible to reduce crystal defect on the surface of the SiGe layer 32a. Specifically, the film thickness of the SiGe layer 32a is set to 1000 angstrom, for example. A GaAs layer or $Fe_3Si$ layer is formed using the SiGe layer as a template.

A device formed on the SiGe layer 32a is a thin-film device; for this reason, the following requirements must be satisfied. Namely, each lattice constant of the SiGe layer 32a and the GaAs layer or each lattice constant of the SiGe layer 32a and the $Fe_3Si$ layer has a need to accurately match. As described above, the SiGe layer 32a is formed thicker, and thereby, it is possible to reduce crystal defect on the surface of the SiGe layer 32a. This serves to prevent deterioration of a device performance.

It should be noted that the crystalline insulating film is not limited to the MgO. For example, materials such as ZnO, $YZrO_2$ and (YSZ) having a lattice constant similar to the SiGe layer are used.

(Fourth Method of Forming an SiGe Layer)

Figure 10A:
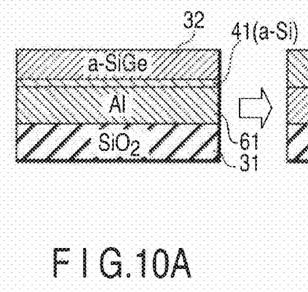
FIGS. 10A to 10C are views showing a method of forming an SiGe layer; specifically, a method of forming an SiGe layer on an insulating film using metal induced crystallization.
Figure 10B:
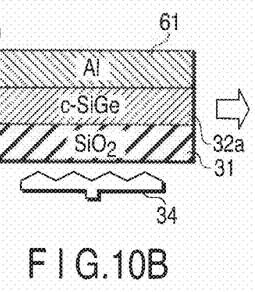
Figure 10C:
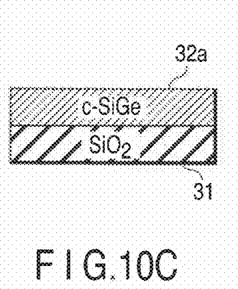

FIGS. 10A to 10C show a method of forming an SiGe layer on an insulating film using metal induced crystallization (MIC).

As shown in FIG. 10A, a silicon oxide film 31 is formed on a substrate (not shown). For example, an aluminum layer 61 is formed as a catalytic metal on the silicon oxide film 31. An amorphous Si layer 41 is formed on the aluminum layer 61, and further, an amorphous SiGe layer 32 is formed on the amorphous Si layer 41.

Thereafter, as illustrated in FIG. 10B, heat treatment is carried out with respect to the substrate using a heater 34, for example. The heat treatment temperature is 500° C. or less, for example. By means of the heat treatment, the aluminum layer 61 is replaced with the amorphous Si layer 41 and the amorphous SiGe 32. The replacement is made, and simultaneously, the amorphous Si layer 41 and the amorphous SiGe layer 32 are mixed, and then, crystallized. In this way, an SiGe layer 32a is formed on the silicon oxide film 31. If the amorphous Si layer 41 is not provided, SiGe and Al un-uniformly react in the initial reaction process. In other words, the amorphous Si layer 41 is used, and thereby, the initial reaction process is uniformly carried out.

As seen from FIG. 10C, the aluminum layer 61 on the SiGe layer 32 is removed by wet etching using phosphoric acid.

Therefore, according to the metal induced crystallization, it is possible to form an SiGe layer having a preferable film quality.

(Method of Manufacturing a Semiconductor Device)

FIGS. 11A to 11D schematically show a method of manufacturing a monolithic semiconductor device according to the first embodiment shown in FIG. 1. According to the first embodiment, the first range A as the region for forming a transistor or CMOS transistor 11 and the second range B as the region for forming functional elements are formed on the surface of the silicon substrate 10. When the functional elements formed on the second range B are formed, various methods are given as the method of forming an SiGe layer functioning as a buffer layer, as described above. Hereinafter, the case of using liquid-phase epitaxial growth will be described.

If the functional elements formed on the second range B are formed using the liquid-phase epitaxial growth, higher treatment temperature is required compared with the heat treatment temperature when the CMOS transistor formed on the first range is formed. For this reason, if the functional elements are formed after the CMOS transistor is formed, a big damage is given to the CMOS transistor. In view of the reason, when the semiconductor device according to the first embodiment is manufactured using the liquid-phase epitaxial growth, there is a need to previously form functional elements on the second range B.

Figure 11A:
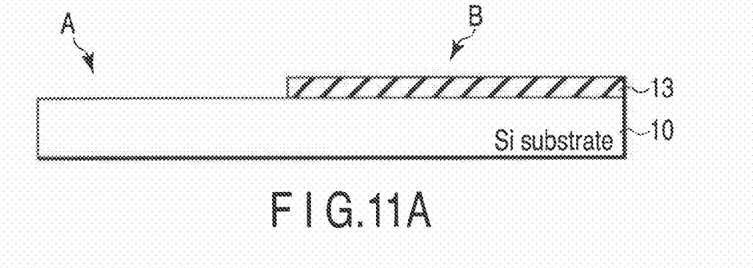
FIGS. 11A to 11D are cross-sectional views schematically showing a method of manufacturing a monolithic type semiconductor device according to the first embodiment shown in FIG. 1.

Specifically, as shown in FIG. 11A, a silicon oxide film is formed as an insulating film 13 on the second range B of the silicon substrate 10, for example.

Figure 11B:
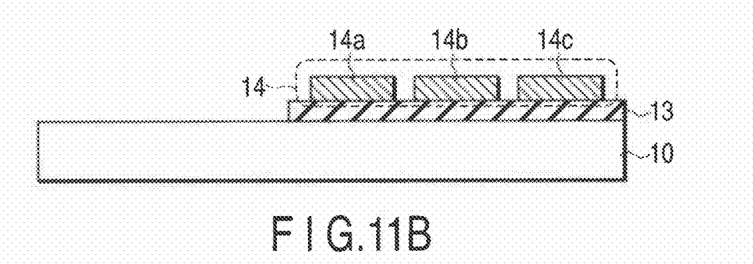

Thereafter, as illustrated in FIG. 11B, SiGe layers 14a, 14b and 14c are formed as a universal buffer layer 14 on the insulating film 13. These SiGe layers 14a, 14b and 14c are formed using the liquid-phase epitaxial growth shown in the first method. Each lattice constant of these SiGe layers 14a, 14b and 14c is matched with each lattice constant of functional elements formed thereon. The SiGe layers 14a, 14b and 14c are isolated by an insulating film (not shown).

Figure 11C:
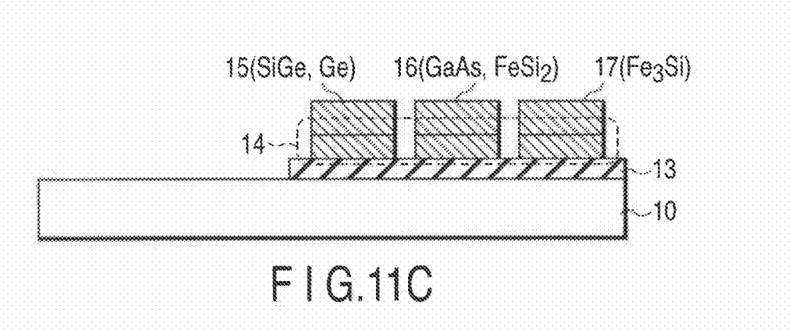

As depicted in FIG. 11C, the following layers 15, 16 and 17 are successively formed on SiGe layers 14a, 14b and 14c, respectively, from a material having high heat treatment temperature. For example, an SiGe layer or Ge layer 15 is formed as a layer for forming an electronic functional element. A GaAs layer or $FeSi_2$ layer 16 is formed as a layer for forming an optical functional element. An $Fe_3Si$ layer 17 is formed as a layer for forming a spin functional element. Further, the SiGe layer or Ge layer 15, GaAs layer or $FeSi_2$ layer 16 and $Fe_3Si$ layer 17 are formed, and simultaneously, desired functional elements are formed. In this way, various functional elements are formed on the second range B.

Figure 11D:
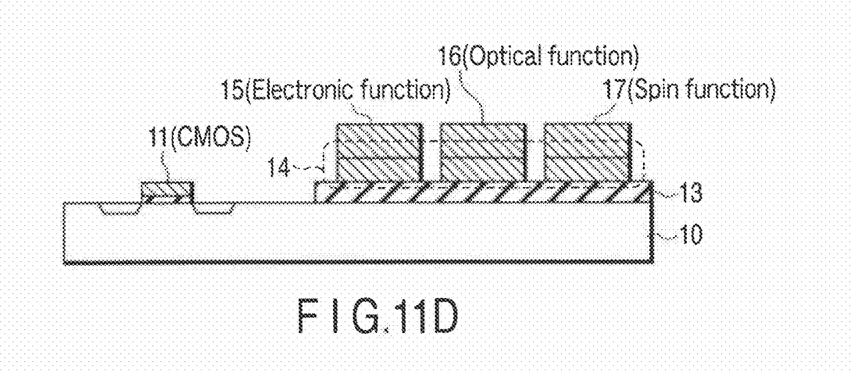

Thereafter, as seen from FIG. 11D, a CMOS transistor 11 is formed on the first range A using a known technique.

According to the method, it is possible to form a high-performance semiconductor device including a CMOS transistor, an electronic functional element, an optical functional element and a spin functional element, which are formed on one silicon substrate.

It should be noted that a method of forming an SiGe layer functioning as a buffer layer is not limited to liquid-phase epitaxial growth. In this case, the SiGe layer is formed using any one of the first to fourth methods or using combination of some methods. In addition, the order of manufacturing the first and second ranges A and B may be properly changed in accordance with selection of the methods.

FIGS. 12A to 12E schematically show a method of manufacturing a three-dimensional structure semiconductor device according to the second embodiment.

Figures 12A, 12B, 12C, 12D, 12E:
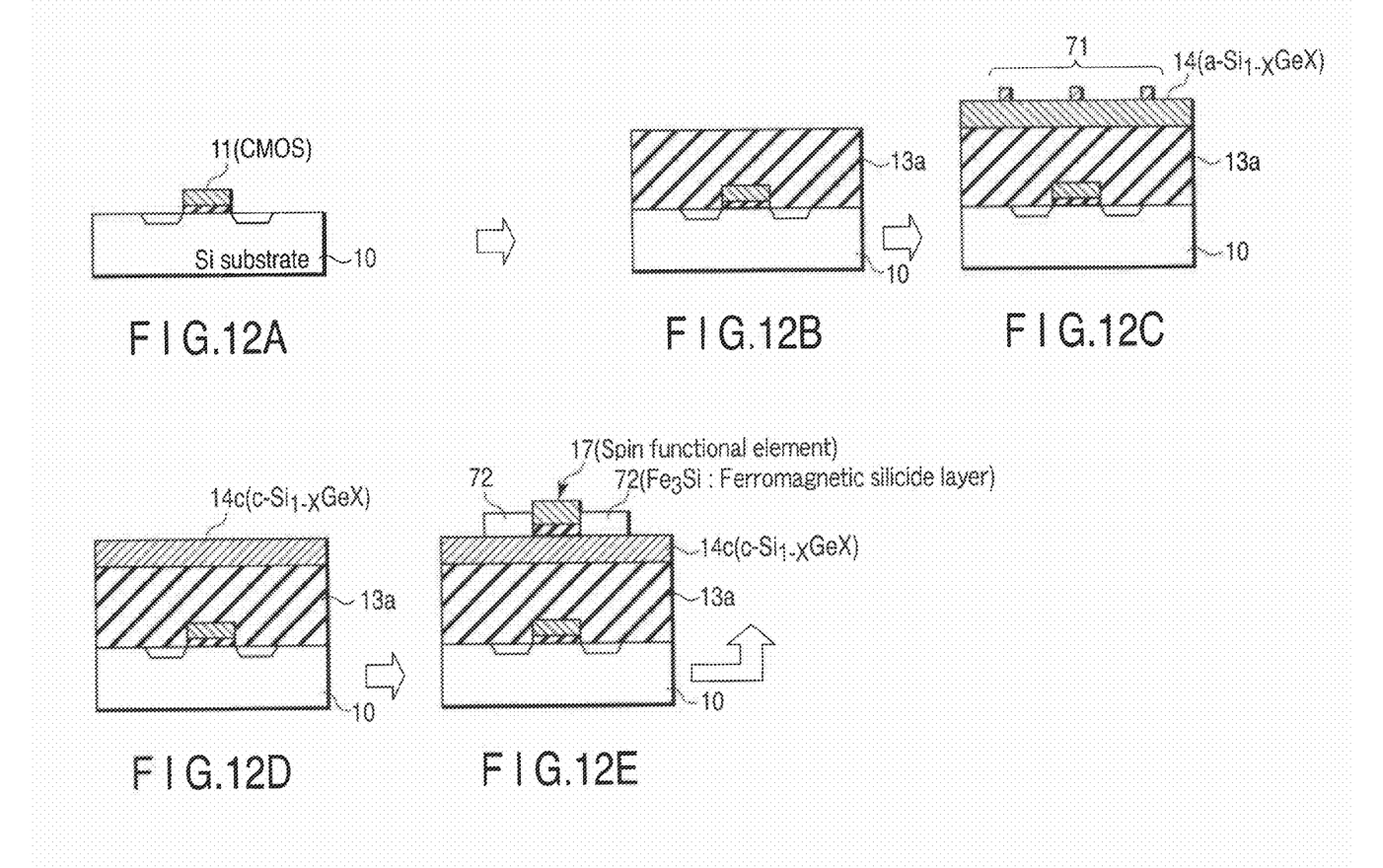
FIGS. 12A to 12E are cross-sectional views schematically showing a method of manufacturing a three-dimensional structure semiconductor device according to a second embodiment.

As shown in FIG. 12A, the surface of a silicon substrate 10 is formed with a CMOS transistor 11 using a known technique.

Thereafter, as illustrated in FIG. 12B, an interlayer insulating film 13a is formed on the substrate 10. The interlayer insulating film 13a is a silicon oxide film (e.g., TEOS film) formed at 500° C. or less, for example.

As depicted in FIG. 12C, a buffer layer, for example, an amorphous $Si_{1-x}Ge_x$ layer 14 is formed on the interlayer insulating film 13a. The lattice constant of the amorphous $Si_{1-x}Ge_x$ layer 14 is tuned to a lattice constant of an $Fe_3Si$ layer 17 formed thereon. Any one of the first to fourth methods is employed as the method of crystallizing the amorphous $Si_{1-x}Ge_x$ layer 14. For example, the case of using a catalytic metal will be described below. Specifically, a plurality of catalytic metals 71 is imprinted on the amorphous $Si_{1-x}Ge_x$ layer 14. For example, one of materials such as Ni, Cu, Pd and Co is usable as the catalytic metal.

Thereafter, as seen from FIG. 12D, heat treatment is carried out with respected to the substrate 10. The heat treatment temperature is 200° C. or more, that is, preferably, 500° or less, which gives no damage to the CMOS transistor 11. By means of the heat treatment, the amorphous $Si_{1-x}Ge_x$ layer 14 is crystallized from a portion on which the catalytic metal 71 is imprinted, and thus, an $Si_{1-x}Ge_x$ layer 14c is formed.

As shown in FIG. 12E, the $Fe_3Si$ layer 17 having a lattice constant equal to the $Si_{1-x}Ge_x$ layer 14c is formed on the $Si_{1-x}Ge_x$ layer 14c. Thus, a spin functional element is formed using the $Fe_3Si$ layer 17.

In the same manner as the process shown in FIG. 12B, an insulating film 13b (shown in FIG. 3) covering the spin functional element is formed on the $Si_{1-x}Ge_x$ layer 14c. In the same manner as the process shown in FIG. 12C, an amorphous $Si_{1-x}Ge_x$ layer having a controlled mixed crystal ratio is formed to form an optical functional element. Then, a catalytic metal is formed on the amorphous $Si_{1-x}Ge_x$ layer. The heat treatment is carried out with respect to the substrate in the same manner as the process shown in FIG. 12D to crystallize the amorphous $Si_{1-x}Ge_x$ layer. In this way, an $Si_{1-x}Ge_x$ layer 14b (shown in FIG. 3) is formed. Thereafter, in the same manner as the process shown in FIG. 12E, an $FeSi_2$ layer is formed on the $Si_{1-x}Ge_x$ layer 14b, and thus, an optical functional element is formed on the $FeSi_2$ layer.

According to the method, the insulating film 13a is formed on the silicon substrate 10 formed with the CMOS transistor 11. Then, the $Fe_3Si$ layer 17 is formed on the insulating film 13a via the $Si_{1-x}Ge_x$ layer 14c functioning as a buffer layer. Further, the $FeSi_2$ layer 16 is formed on the insulating film 13b via the $Si_{1-x}Ge_x$ layer 14b functioning as a buffer layer. Therefore, silicon and a plurality of materials having different lattice constant are successively stacked. In this way, it is possible to realize a three-dimensional semiconductor device including a spin functional element and an optical functional element, which are formed on one substrate.

Figure 13:
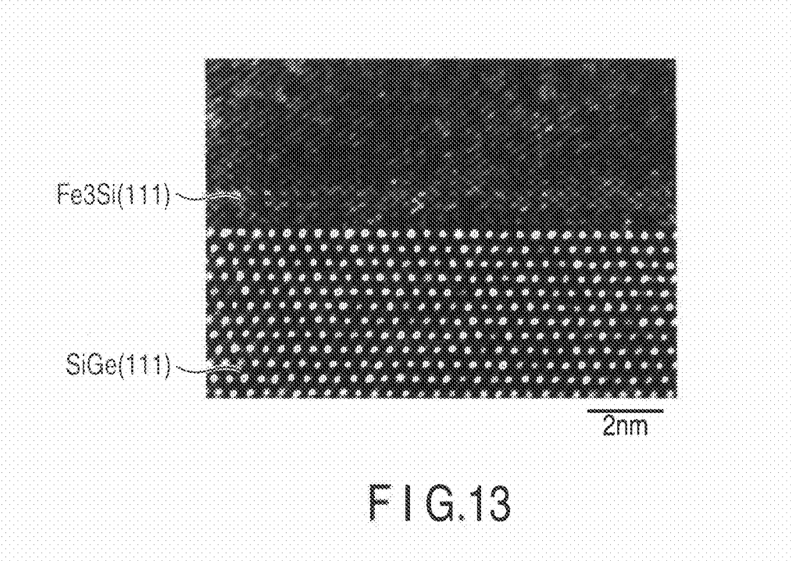
FIG. 13 is an electron microscope photograph showing the case where a new material is formed on an SiGe layer functioning as a buffer layer.

FIG. 13 is an electron microscope photograph showing a state that an SiGe layer as a buffer layer is formed with a new material. As seen from the photograph, a preferable $Fe_3Si$ layer is formed on the SiGe layer.

Figure 14:
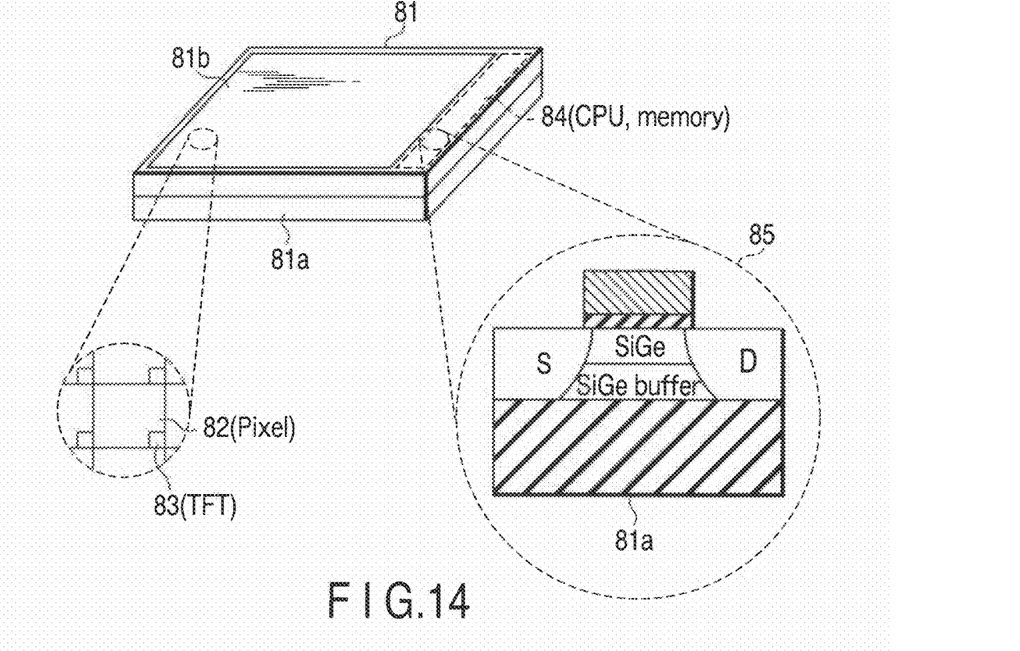
FIG. 14 is a view showing the case where the present invention is applied to a display device.

FIG. 14 shows an applied example of the present invention, for example, the case where the present invention is applied to a display device. In a display device 81, the surface of a glass substrate 81a is provided with a display unit 81b. The display unit 81b includes a plurality of pixels 82 arrayed like a matrix. Each pixel is driven by a drive circuit comprising a thin-film transistor (TFT) 83. For example, a peripheral circuit 84 of the display unit 81b includes a CPU and memory, which function as an operation device. The operation device requires a high-speed operation. For this reason, the operation device comprises a thin-film transistor 85 having an SiGe channel region, for example.

A method of forming the thin-film transistor 85 is the same as the embodiments. For example, an SiGe layer as a buffer layer and an SiGe layer having crystal orientation aligned with the SiGe layer is formed on the glass substrate 81a as an insulating film. The thin-film transistor 85 having an SiGe channel region is formed on the SiGe layer.

According to the applied example, it is possible to configure a display device, which is integrated with the display unit 81b and the high-speed operation device.

Figure 15:
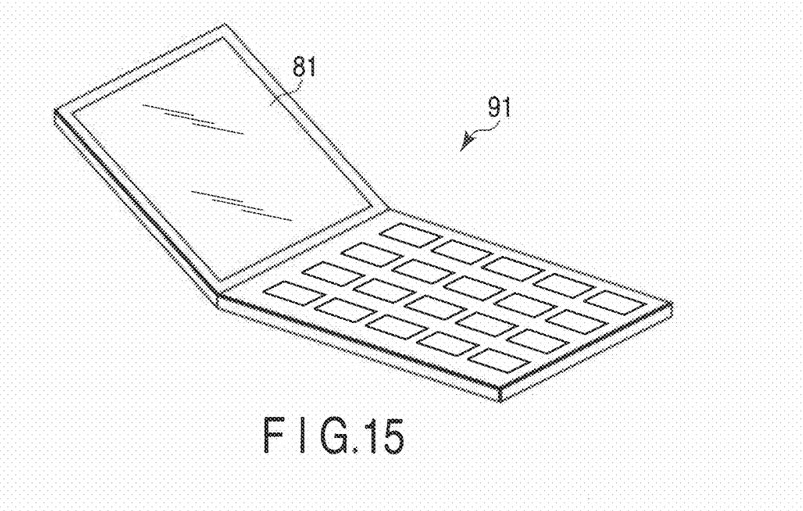
FIG. 15 is a view showing the case where the display device shown in FIG. 14 is applied to a mobile phone.

As seen from FIG. 15, the display device 81 is applied to a mobile terminal device such as a mobile phone 91, for example. In this way, the performance of these devices can be greatly improved.

As described above, an SiGe layer is formed on the insulating film as a universal buffer layer having a lattice constant matched with a material formed on the SiGe layer. In this way, a plurality of elements having an electronic function, an optical function and a spin function is integrated on a silicon substrate. Thus, a semiconductor device having a plurality of functional elements can be provided on one chip. Therefore, this serves to achieve miniaturization, scale reduction and high functionality of a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming an insulating film on a silicon substrate;
    forming an amorphous SiGe layer directly on and completely covers the insulating film;
    heating the silicon substrate so that the amorphous SiGe layer is laterally solid-phase or liquid-phase grown on the insulating film, and thereby, forming a crystallized SiGe layer as a buffer layer on the silicon substrate and the insulating film; and
    forming a material layer including a functional element directly on said crystallized SiGe layer;
    wherein forming the amorphous SiGe layer includes forming the amorphous SiGe layer with a mixed crystal ratio of silicon and germanium so as to match a lattice constant of the crystallized SiGe layer with a lattice constant of the material which is subsequently formed on the crystallized SiGe layer.

2. The method according to claim 1, further comprising:
    forming a trench in the silicon substrate; and
    forming the insulating film in the trench.

3. The method according to claim 1, further comprising:
    forming an insulating layer on the amorphous SiGe layer before the heating.

4. The method according to claim 1, wherein the material layer comprises an $Fe_3Si$ layer.

5. The method according to claim 4, wherein a lattice constant of the crystallized SiGe layer is matched with a lattice constant of the $Fe_3Si$ layer.

6. A method of manufacturing a semiconductor device, comprising:
- forming insulating films on a silicon substrate;
- forming an amorphous SiGe layer directly on and completely covers the insulating films;
- heating the silicon substrate so that the amorphous SiGe layer is laterally solid-phase or liquid-phase grown on the insulating films, and thereby, forming a crystallized SiGe layer as a buffer layer on the insulating film; and
- forming material layers including different materials on the crystallized SiGe layer, each of the material layers including a functional element;
- wherein forming the amorphous SiGe layer includes forming the amorphous SiGe layer with a mixed crystal ratio of silicon and germanium so as to match a lattice constant of the crystallized SiGe layer with a lattice constant of each of the material layers subsequently formed on said crystallized SiGe layer.

* * * * *